(12) United States Patent
Bayerer et al.

(10) Patent No.: US 7,701,051 B2
(45) Date of Patent: Apr. 20, 2010

(54) POWER SEMICONDUCTOR MODULE

(75) Inventors: Reinhold Bayerer, Warstein (DE);
Markus Thoben, Soest (DE)

(73) Assignee: Infineon Technologies AG, Neubiberg (DE)

( * ) Notice: Subject to any disclaimer, the term of this patent is extended or adjusted under 35 U.S.C. 154(b) by 741 days.

(21) Appl. No.: 11/234,999

(22) Filed: Sep. 26, 2005

(65) Prior Publication Data

US 2006/0072261 A1    Apr. 6, 2006

(30) Foreign Application Priority Data

Sep. 27, 2004    (DE)    ........................ 10 2004 046 806

(51) Int. Cl.
*H01L 23/12*    (2006.01)
(52) U.S. Cl. ........................ 257/700; 257/724; 257/725; 257/E23.01
(58) Field of Classification Search ................ 257/700, 257/724, 725, E23.01
See application file for complete search history.

(56) References Cited

U.S. PATENT DOCUMENTS 5,637,922 A    6/1997    Fillion et al. ................. 257/728

5,856,913 A *  1/1999    Heilbronner ................. 361/760
2004/0056349 A1*  3/2004    Yamada et al. .............. 257/724

FOREIGN PATENT DOCUMENTS

| DE | 196 17 055 C1 | 6/1997 |
| DE | 19549011 A1 | 7/1997 |
| DE | 69532700 T2 | 1/2005 |
| JP | 08293578 A | 11/1996 |
| WO | WO 03/030247 A2 | 4/2003 |

OTHER PUBLICATIONS

German Office Action; 10 2004 046 806.0-33; 3 pp., Apr. 25, 2005.

* cited by examiner

*Primary Examiner*—Lex Malsawma
(74) *Attorney, Agent, or Firm*—Coats & Bennett, P.L.L.C.

(57)    ABSTRACT

A power semiconductor module (1) has power semiconductor components (2, 4, 6, 8, 10, 12) arranged on a substrate (14), at least one portion of which components is connected in parallel and arranged symmetrically on the substrate (14). A second conduction plane (24, 26) is provided for making contact with the power semiconductor components (2, 4, 6, 8, 10, 12). The second conduction plane is arranged in a manner electrically insulated from the substrate surface (16) above the surfaces of the power semiconductor components (2, 4, 6, 8, 10, 12) that are remote from the substrate surface (16).

20 Claims, 6 Drawing Sheets

POWER SEMICONDUCTOR MODULE

CROSS-REFERENCE TO RELATED APPLICATIONS

This application claims priority from German Patent Application No. 10 2004 046 806.0, which was filed on Sep. 27, 2004, and is incorporated herein by reference in its entirety.

TECHNICAL FIELD

Power semiconductor modules are usually used for controlling and switching large current intensities. Power semiconductor components of this type are disclosed for example in WO 03/030247 A2 or U.S. Pat. No. 5,637,922 A.

BACKGROUND

The current-carrying capacity of such power semiconductor modules is limited. Thus, for example on account of the evolution of heat that accompanies the control or switching of high currents, power semiconductor modules with a limited area can only be loaded up to a certain current intensity.

SUMMARY

Therefore, the invention is based on the problem of providing a power semiconductor module having an increased current-carrying capacity per area of the power semiconductor module.

This problem can be solved by a power semiconductor module comprising power semiconductor components arranged on a substrate, at least one portion of the power semiconductor components being electrically connected in parallel and arranged symmetrically on the substrate, wherein a second conduction plane is provided for making contact with the power semiconductor components, said second conduction plane being arranged in a manner electrically insulated from the substrate surface above the surfaces of the power semiconductor components that are remote from the substrate surface.

The power semiconductor components connected in parallel can be identical. The substrate surface facing the power semiconductor components can be subdivided into two area sections embodied in electrically conductive fashion. The area sections can be electrically conductively connected to one another in a half-bridge circuit by means of connection in series. Contact areas for supply and control lines of the power semiconductor components can be in each case provided on the surfaces of the power semiconductor components that are remote from the substrate surface. Mutually corresponding supply and control lines of power semiconductor components connected in parallel can be in each case connected by a contiguous metallization, in particular by a metallization having a thickness in a range of 20 µm to 1 mm. The geometrical structure of the contiguous metallizations can be configured in such a way as to suppress the arising of parasitic oscillations, in particular of parasitic oscillations having frequencies of above 100 MHz. For the purpose of insulating the second conduction plane from the substrate surface, at least one insulating film comprising magnetic constituents can be arranged between these. At least one magnetic film that at least partly may cover the second conduction plane is arranged on that side of the second conduction plane which is remote from the substrate surface. At least one portion of the power semiconductor components can be transistors, in particular insulated gate bipolar transistors. At least one portion of the gate contacts can be connected to one another by means of narrow, thin interconnects, the length, width and thickness of the interconnects being dimensioned such that a distributed resistance having a resistance value>0.1 ohm is provided upstream of each of the transistors contact-connected to the interconnects. In the case of at least one transistor, the contact connection of the emitter in the case of the control circuit formed from gate and emitter and in the case of the load circuit formed from emitter and collector can be realized via the same contact. Terminal pins for a +/− intermediate circuit can be arranged along the longitudinal sides of the power semiconductor module. The remaining terminal pins can be arranged on the sides of the power semiconductor module. At least one portion of an intermediate-circuit capacitor can be arranged in the power semiconductor module above the power semiconductor components, this portion of the intermediate-circuit capacitor being configured in parallelepidal fashion, in particular. The intermediate-circuit capacitor can be arranged on a printed circuit board and the printed circuit board is connected to the power semiconductor module by soldering and/or pressing the intermediate-circuit capacitor onto the power semiconductor module. At least one portion of the connections provided on the power semiconductor module can be integrally cast to form terminal pins. At least one frame can be provided on the power semiconductor module, the frame being dimensioned and arranged such that it protects the connections at least in part against being touched and against mechanical damage.

The basic concept of the invention, in the case of a power semiconductor module comprising power semiconductor components on a substrate, is for at least one portion of the power semiconductor components to be connected in parallel and arranged symmetrically on the substrate. This means that the heat loss or waste heat arising in the power semiconductor components is distributed better between the whole substrate area and thus also approximately over the entire underside of the substrate remote from the power semiconductor components. This then results in an improved thermal resistance between the power semiconductor components and a heat sink, which is usually arranged on the underside of the substrate, and also with respect to the surroundings.

A second conduction plane lying in insulated fashion above the substrate conductor plane and the chips is utilized for the wiring of the power semiconductor chips. This makes it possible to eliminate the isolation trenches and interconnects alongside the soldering areas of the chips and to utilize the area for soldering on larger chips or preferably further chips connected in parallel. The design of the module means that the chips are symmetrically arranged in low-inductance fashion.

The thermal resistances are drastically reduced, with reductions in the region of 30% being possible. This effect results from the utilization—possible in this way—of the thermal spreading in the substrate and the layers adjoining the latter, such as, for example, thermally conductive pastes or heat sinks. Consequently, the heat loss of the power semiconductor components is dissipated significantly better, so that the latter can switch and control larger current intensities than in the case of a conventional configuration of the power semiconductor module, without incurring damage in this case.

BRIEF DESCRIPTION OF THE DRAWINGS

The invention is explained in more detail below on the basis of an exemplary embodiment illustrated in the figures of the drawing, in which.

DETAILED DESCRIPTION

Figure 1:
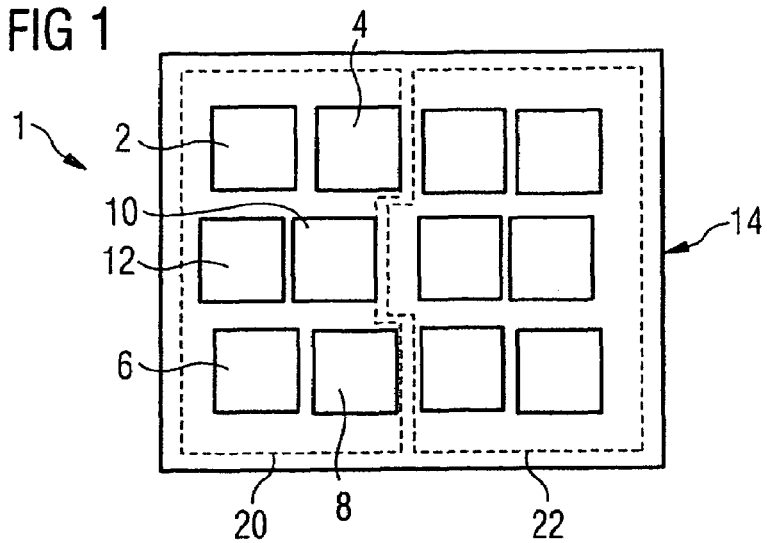
FIG. 1 shows the schematic illustration of the basic construction of an exemplary embodiment of the power semiconductor module according to the invention.

FIG. 1 shows a schematic illustration of the basic construction of a power semiconductor module 1 according to the invention, in which, on the substrate surface 16 of the substrate 14, power semiconductor components in the form of the insulated gate bipolar transistors (IGBT) 2, 4, 6, 8 and the diodes 10 and 12 are arranged in conceptionally subdivided area sections 20 and 22 of the substrate surface 16. The first area section 20 and second area section 22 are embodied in identical fashion and thus equipped with the same power semiconductor components 2, 4, 6, 8, 10 and 12.

In one advantageous configuration variant, the two area sections 20 and 22 are embodied in electrically conductive fashion, which may be realized in particular by providing a DCB (direct copper bonding) substrate as the substrate 14.

Figure 2:
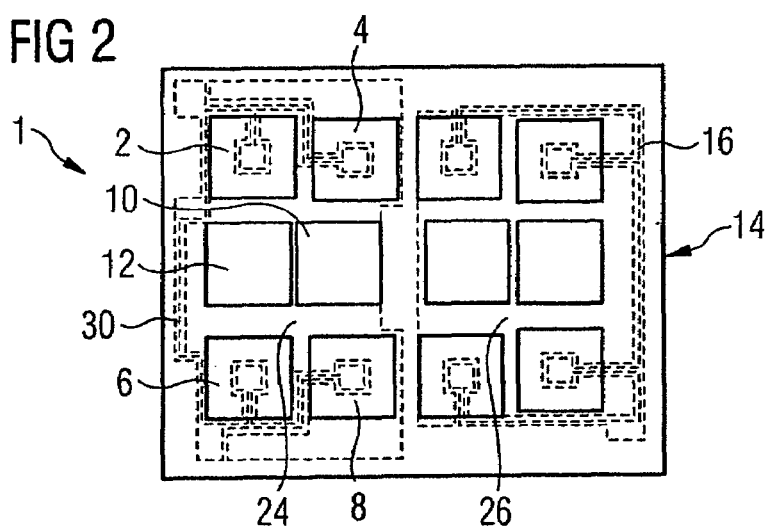
FIG. 2 shows the metallizations in a second conduction plane of the power semiconductor module from FIG. 1.

In one development of the invention, contact is made with the power semiconductor components 2, 4, 6, 8, 10 and 12 in a second conduction plane, which, in the exemplary embodiment illustrated in FIG. 2, is formed by the metallizations in the second conduction plane 24 and 26. Said second conduction plane or the metallizations 24 and 26 arranged therein are arranged in a manner electrically insulated from the substrate surface 16 above the surfaces of the power semiconductor components 2, 4, 6, 8, 10 and 12 that are remote from said substrate surface 16.

The provision of said second conduction plane means that isolation trenches and interconnects which are usually arranged alongside soldering areas for the power semiconductor components on the substrate surface 16 can be removed from said substrate surface 16. A free region of the substrate surface is accordingly obtained which can be utilized for soldering on larger power semiconductor components or preferably for the arrangement of further power semiconductor components, connected in parallel. Consequently, a higher current- or power-carrying capacity of the power semiconductor module can be achieved relative to the area of the power semiconductor module.

Furthermore, contact areas for supply and control lines 30 of the power semiconductor components 2, 4, 6, 8, 10, 12 are in each case preferably provided on the surfaces of said power semiconductor components 2, 4, 6, 8, 10, 12 that are remote from the substrate surface 16.

In the exemplary embodiment illustrated in FIGS. 1 and 2, the IGBTs 2, 4, 6 and 8 are connected in parallel and arranged symmetrically with regard to the terminals of the power semiconductor module. Furthermore, the diodes 10 and 12 are connected in parallel and arranged symmetrically in the same way.

Furthermore, the IGBTs 2, 4, 6 and 8 are designed for the same nominal current, for example 25 A, and thus replace an IGBT having a nominal current of 100 A. The diodes 10 and 12 are also embodied identically with their nominal current, for example 50 A diodes which, taken together, replace a 100 A diode.

The symmetrical arrangement of the power semiconductor components 2, 4, 6, 8, 10, 12 and also the identical embodiment thereof result in a uniform loading on the semiconductors and current paths. The results of simulation calculations as illustrated in FIG. 7 show what influence replacing a power semiconductor component having a high nominal current by a plurality of power semiconductor components 2, 4, 6, 8 that are connected in parallel and arranged symmetrically and have a smaller nominal current has on the temperature distribution in a power semiconductor module in the operating state.

Figure 7A:
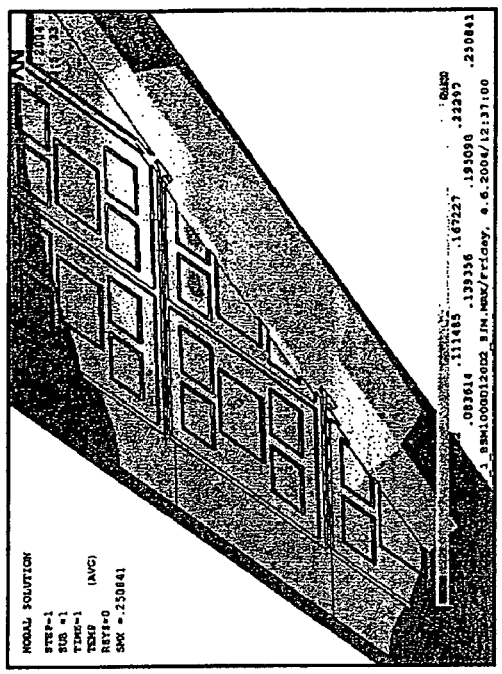
FIG. 7 shows a comparative illustration of the simulated temperature distribution in a conventional power semiconductor module (a) and a power semiconductor module according to the invention (b)
Figure 7A:
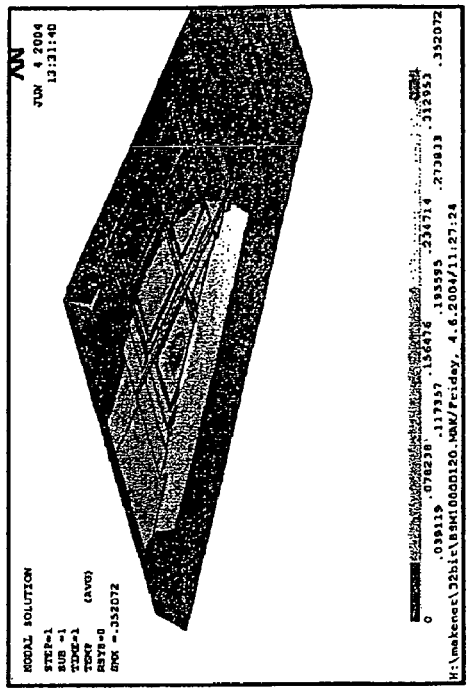
Figure 7A:
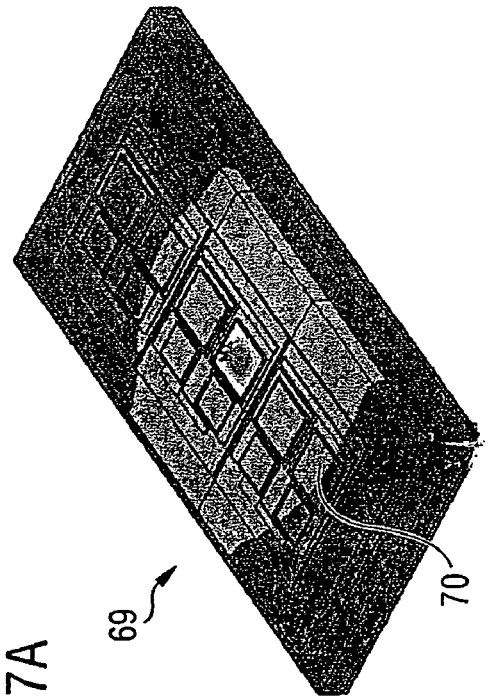
Figure 7B:
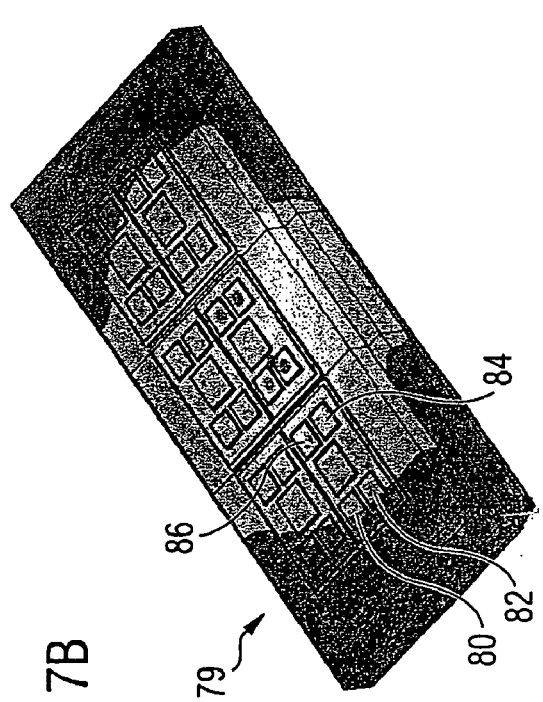

FIG. 7a shows the temperature distribution in a power semiconductor module 69 provided with an IGBT having a nominal current of 100 A. By contrast, FIG. 7b illustrates the temperature distribution in a corresponding power semiconductor module 79 provided with four IGBTs having a nominal current of 25 A 80, 82, 84, 86. For the sake of clarity, both simulation calculations assumed that only one area section in each case is in operation. A comparison of the temperature distributions shows that, in the case of the power semiconductor module 79, the waste heat or heat loss of the IGBTs 80, 82, 84 and 86 is distributed significantly better between the whole substrate area and thus also approximately between the whole underside of the substrate, so that it can be dissipated better.

Figure 8:
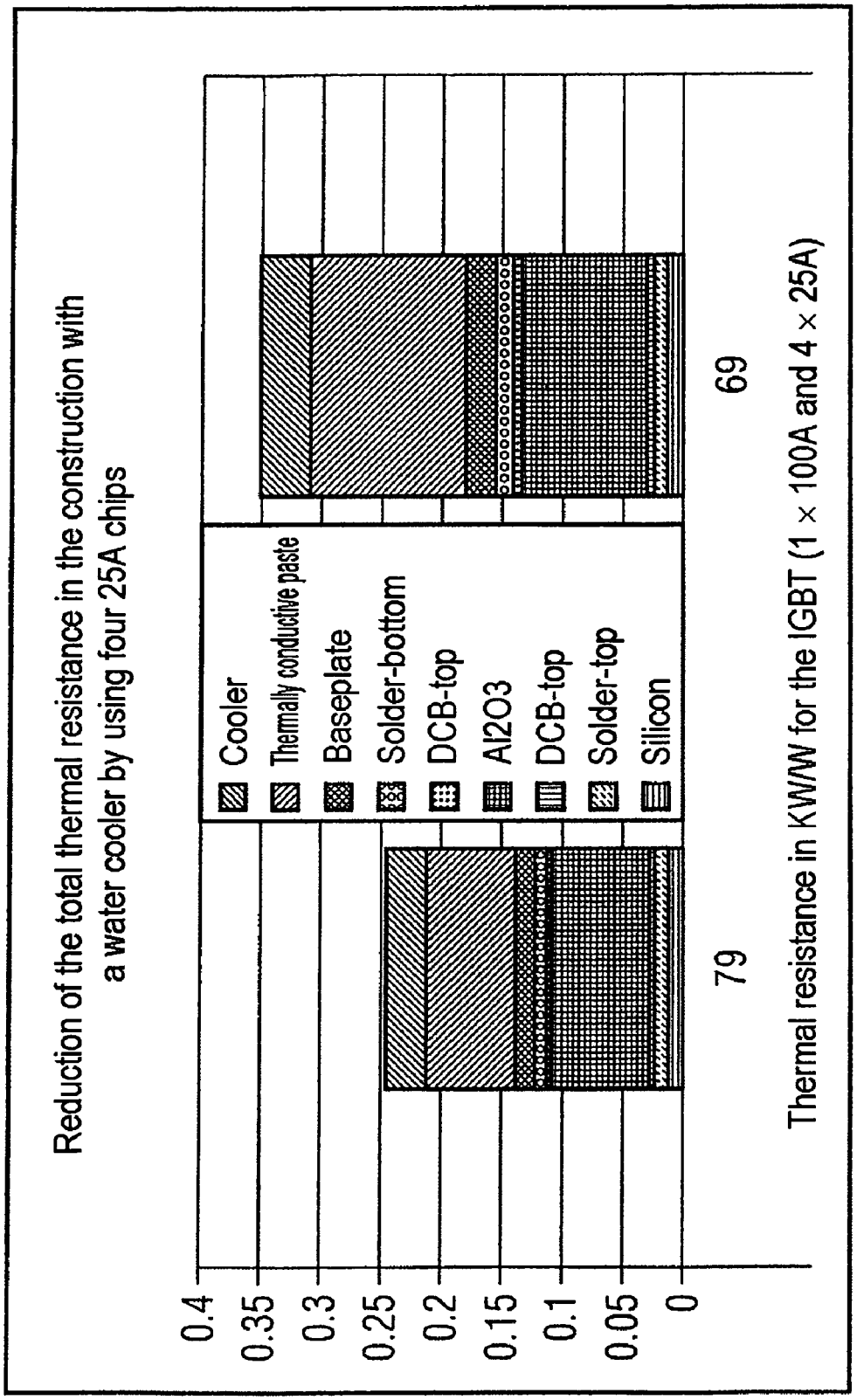
FIG. 8 shows the thermal resistance in the case of a water-cooled power semiconductor module according to the invention.

Accordingly, the thermal resistance for the power semiconductor module 69 or 100 A IGBT turns out to be significantly higher than for the sum of the four 25 A IGBTs in the power semiconductor module 79. These facts are illustrated in FIG. 8, which shows the thermal resistances in the power semiconductor modules 69 and 79, respectively, under operating conditions. The thermal resistances in those layers that are connected to the power semiconductor modules in the operating state were also taken into account here. These are specifically a cooler, a thermally conductive paste, a baseplate, a solder connecting the baseplate to the underside of the substrate, which is embodied as a DCB substrate, the core of the substrate made of $Al_2O_3$, the above copper layer of the DCB substrate, the top-side solder and also the silicon of the power semiconductor components.

On account of the reduced thermal resistance, it is possible, in the case of power semiconductor modules according to the invention, to provide power semiconductor components whose nominal current in total lies above the nominal current that an individual power semiconductor component may have without incurring damage during operation on account of accumulated heat loss. A higher current-carrying capacity consequently results for the power semiconductor module according to the invention given a comparable area.

In one development of the invention, the two area sections 20 and 22 are electrically conductively connected to one another by means of a connection in series. A half-bridge circuit can be realized in a simple manner in this way.

One advantageous configuration variant of the invention provides for mutually corresponding supply and control lines 30 of power semiconductor components 2, 4, 6, 8, 10, 12 connected in parallel in each case to be connected by a contiguous metallization, these metallizations preferably being arranged in the second conduction plane. In the exemplary embodiment illustrated in FIG. 2, these metallizations are formed by the metallizations in the second conduction plane 24 and 26 which respectively interconnect corresponding anodes, cathodes, emitters, gates or bases of the IGBTs or diodes.

The contiguous metallizations 24, 26 preferably have a thickness in a range of 20 μm to 1 mm.

One advantageous development of the invention furthermore provides for the geometrical structure of the contiguous metallizations 24, 26 to be configured in such a way as to avoid the arising of parasitic oscillations, during operation of the power semiconductor module 1 in particular of parasitic oscillations having frequencies of above 100 MHz. Such parasitic oscillations generally occur primarily in switching operations. With regard to more detailed explanations on the geometrical structure of the contiguous metallization and also on the method of operation thereof, reference shall be made to DE 101 59 851 at this juncture. An exemplary embodiment of such a geometrical structure of the metallization that suppresses parasitic oscillations is provided by metallizations in the second conduction plane 24 and 26 in FIG. 2.

Preferably, the power semiconductor components 2, 4, 6, 8, 10, 12 are directly connected to one another in order to obtain very high natural frequencies of the resonant circuit formed from the capacitances of the power semiconductor components 2, 4, 6, 8, 10, 12 and the inductances of the interconnections, so that these cannot be excited by switching operations.

Figure 3:
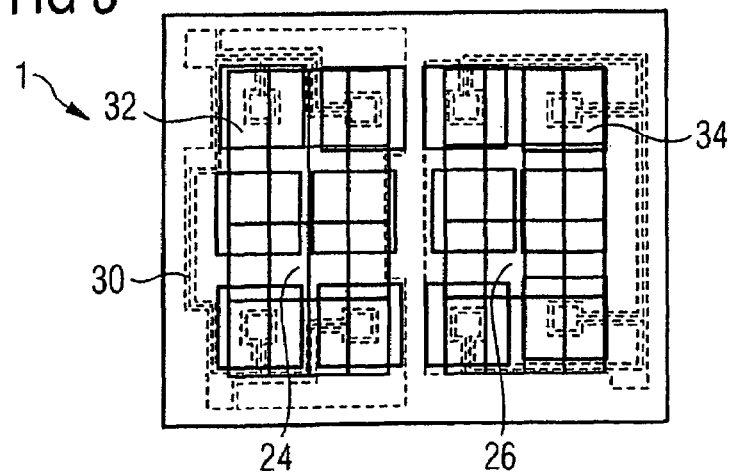
FIG. 3 shows a power semiconductor module from FIG. 2 provided with magnetic films.

In a further configuration variant of the invention, it is provided that for the purpose of insulating the second conduction plane, which is formed by the metallizations 24 and 26 in FIGS. 2 and 3, from the substrate surface 16, at least one insulating film comprising magnetic constituents is arranged between these. The latter effects a slight increase in inductance between the second conduction plane and a conductive area provided on the substrate surface 16, such as, for example, the surface of a DCB substrate. Said increase may be configured such that the natural frequency of the power semiconductor module falls below the excitation frequency of the switching operations, so that parasitic oscillations are suppressed.

Alternatively or supplementarily to this, a further configuration variant of the invention provides for at least one magnetic film that at least partly covers the second conduction plane to be arranged on that side of the second conduction plane which is remote from the substrate surface 16. FIG. 3 schematically illustrates such magnetic films 32, 34 covering the metallizations of the second conduction plane 24 and 26. Their magnetic constituents in turn influence the natural frequency of the power semiconductor module, so that, given a corresponding configuration, this differs sufficiently from the switching frequencies, so that parasitic oscillations can be greatly attenuated or avoided.

In one development of the invention, at least one portion of the gate contacts of those power semiconductor components which are transistors, that is to say the IGBTs 2, 4, 6, 8 in the exemplary embodiment illustrated in FIGS. 1 to 3, is connected by means of narrow, thin interconnects 30, the length, width and thickness of said interconnects 30 being dimensioned such that a distributed resistance having a resistance value greater than 0.1 ohm is provided upstream of each transistor or IGBT 2, 4, 6, 8, 10 contact-connected to said interconnects 30. In this way, it is possible to avoid oscillations in the gate circuit formed from the capacitance of the gate contact, the inductance of the interconnects and also the capacitance between interconnects and top side of the substrate. The integration of corresponding resistances in the relevant power semiconductor component or the arrangement of additional resistances upstream of each relevant power semiconductor component, as is customary according to the prior art, can be obviated in this way. Typical resistance values with which it is possible to obtain a natural frequency of the gate circuit which differs sufficiently from the excitation frequency provided, for example, by switching operations lies in the range between 1 and 8 ohms.

A preferred configuration variant of the invention provides for the gate lines to be arranged on the insulating film arranged between the second conduction plane 24, 26 and the substrate surface 16, the arrangement being realized by vapor-depositing or sputtering on thin TiW and TiCu layers. A CU layer thickness of approximately 200 nm has proved worthwhile for the required conductivities and resistances. Thus, by way of example, with a track having a thickness of 200 nm, a width of 1 mm and a length of 1 cm, it is possible to obtain a gate resistance of approximately 1 ohm. Values in the above-cited resistance range and beyond can be realized by means of suitable alterations of the geometry of the interconnect.

Figure 4:
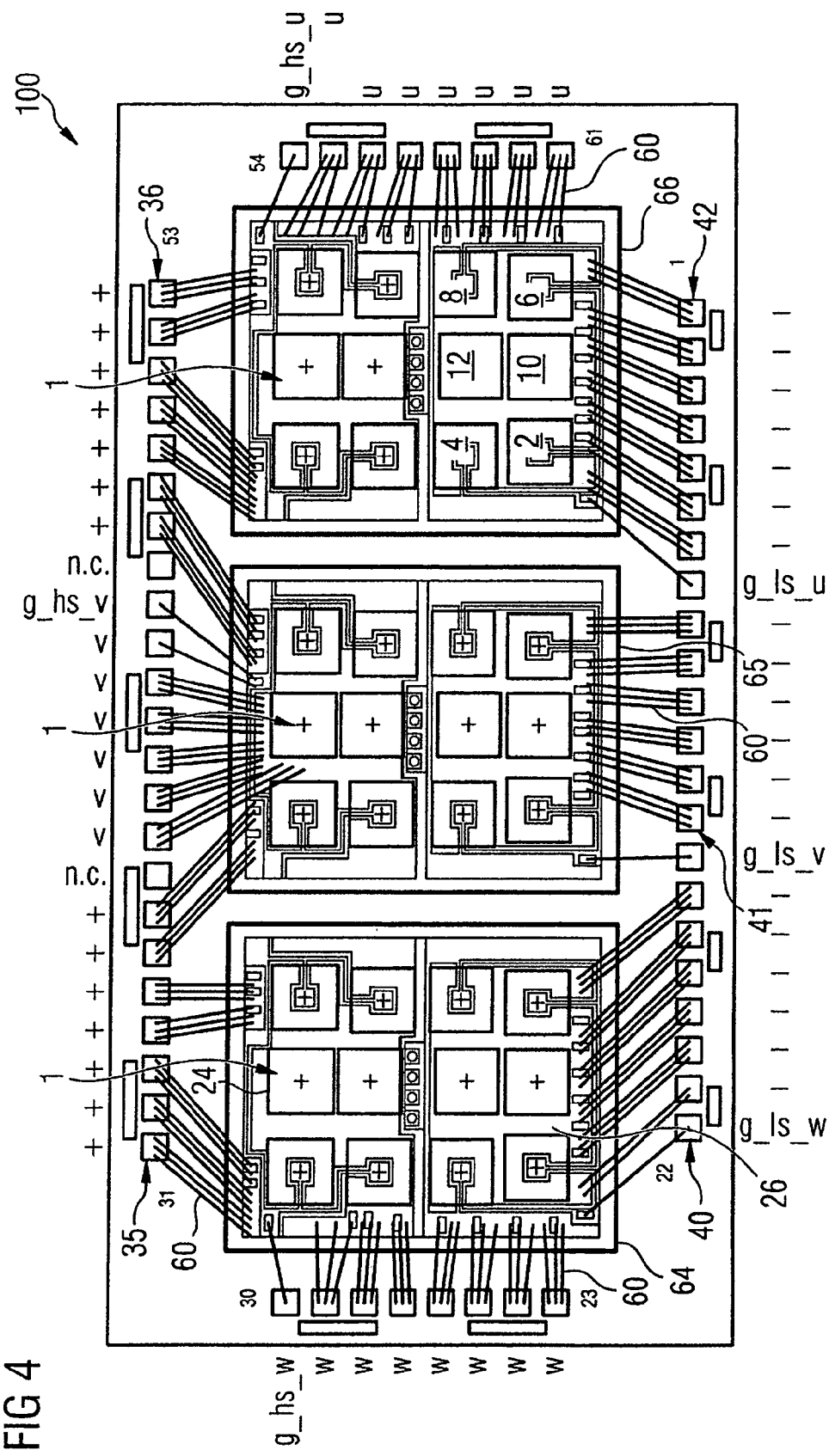
FIG. 4 shows an exemplary embodiment of an extended power semiconductor module constructed from three basis power semiconductor modules in accordance with FIGS. 1 to 3.
Figure 5:
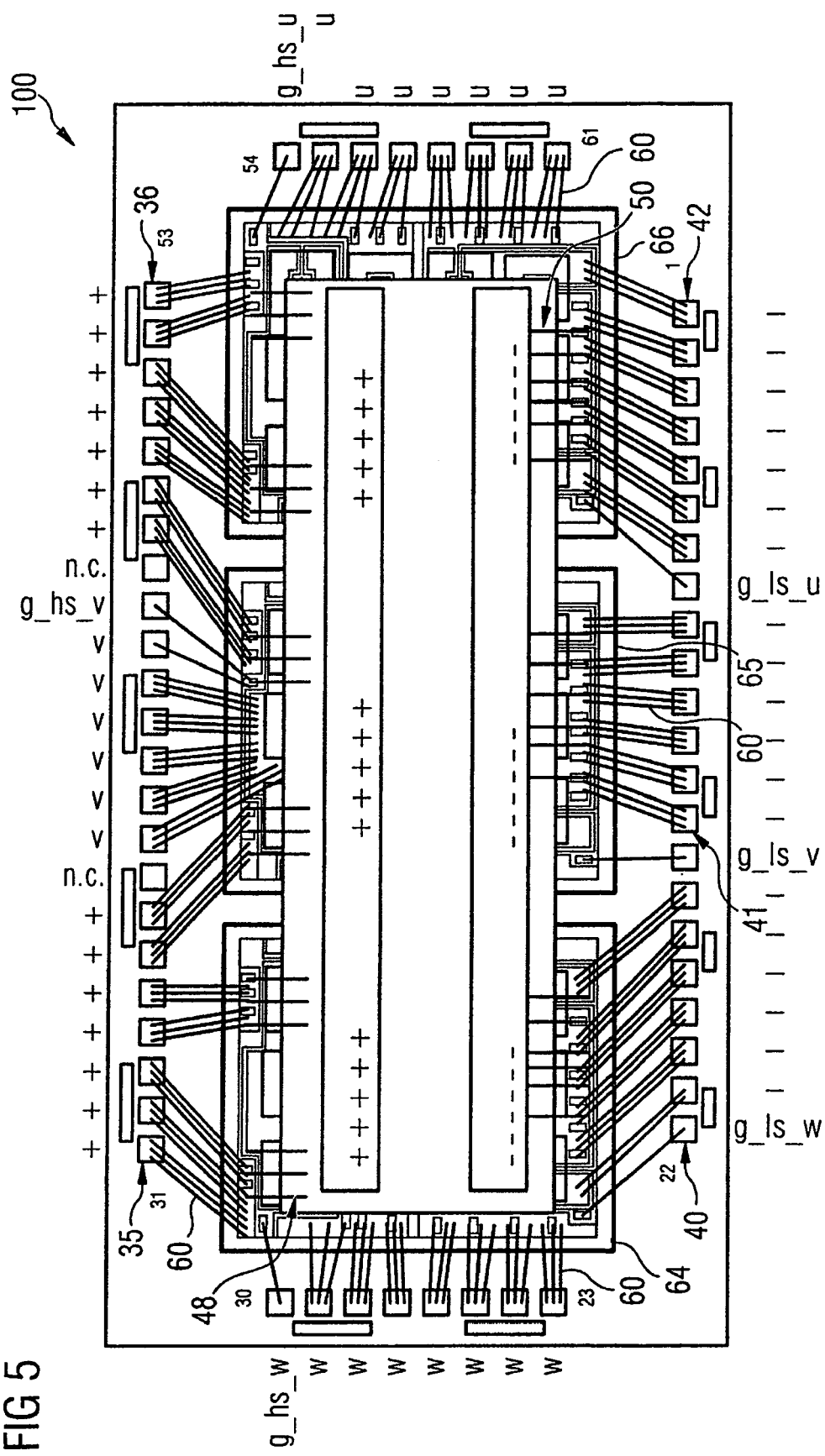
FIG. 5 shows a power semiconductor module from FIG. 4 with an intermediate-circuit capacitor arranged therein.

In an advantageous embodiment of the invention, terminal pins for a +/− intermediate circuit are arranged along the longitudinal sides of the power semiconductor module, as is illustrated on the basis of the exemplary embodiment of the power semiconductor module 100 in FIGS. 4 and 5. The power semiconductor module 100 is constructed from three power semiconductor modules 1 whose construction is illustrated schematically in FIGS. 1 to 3 and has been described in more detail further above.

Furthermore, in the case of at least one transistor or IGBT 2, 4, 6, 8, the contact connection of the emitter in the case of the control circuit formed from gate and emitter and in the case of the load circuit formed from emitter and collector is realized via the same contact. An auxiliary emitter is thus deliberately dispensed with, this being possible on account of the symmetrical internal wiring of the power semiconductor module and the low prevailing inductance. Consequently, there arises an electric circuit from + to − in the +/− intermediate circuit and within the power semiconductor module 100, said circuit having a low inductance and running symmetrically.

In this case, the low inductance results from the wide current conduction and the feedback directly above the flat power semiconductor module 100, for example on a printed circuit board arranged above the latter. The inductance is calculated approximately as the product of width and length of the power semiconductor module multiplied by the permeability of free space $\mu_0$, where the width of the power semiconductor module is to be understood as the elongate extent thereof from the top side of the power semiconductor module to the height level of the power semiconductor components. A typical value for the inductances that can be achieved in this way is 10 nH.

In the case of the power semiconductor module 100 from FIGS. 4 and 5, the terminal pins for the +/− intermediate circuit are formed from the positive terminal pins 35 and 36 and also the negative terminal pins 40, 41, and 42. An intermediate-circuit capacitor that is customarily provided could for example be arranged as a narrow, elongate block on one of the longitudinal sides of the power semiconductor module 100 and be connected e.g. to a two-layered printed circuit board.

Preferably, the remaining terminal pins of the power semiconductor module, the terminal pins for the phase u, v, w in the case of the power semiconductor module 100 from FIGS. 4 and 5, are also arranged along the sides of the power semiconductor module.

This results in a free space in the inner region of the power semiconductor module 100 above the power semiconductor components 2, 4, 6, 8, 10, 12.

In one advantageous development of the invention, at least one portion of an intermediate-circuit capacitor is arranged in the power semiconductor module in the free space described above the power semiconductor components, this portion of the intermediate-circuit capacitor being configured in parallelepipal fashion, in particular.

These facts are illustrated in FIG. 5, which shows an intermediate-circuit capacitor 46 arranged in the described free space of the power semiconductor module 100 above the power semiconductor components 2, 4, 6, 8, 10, 12 (cf. FIG. 4), said capacitor furthermore being configured in parallelepidal fashion. This ultimately leads to a compact design of power semiconductor modules configured in this way.

This design is made possible for power semiconductor modules by virtue of the fact that above the power semiconductor components 2, 4, 6, 8, 10, 12, contrary to the prior art, bonding wires are no longer provided and the layers or films applied on these power semiconductor components are mechanically robust and sufficiently passivated, it being possible for the layers to be produced by lamination methods or the vapor deposition or sputtering techniques already mentioned above. Consequently, in general it is possible to dispense with potting the power semiconductor module and providing a cover for the same, so that a free space in which the intermediate-circuit capacitor can be arranged exists in the inner region of the power semiconductor module.

The intermediate-circuit capacitor is soldered onto the suitable areas of the power semiconductor module or is connected to the substrate and/or terminal pins by means of wire bonding.

Figure 6:
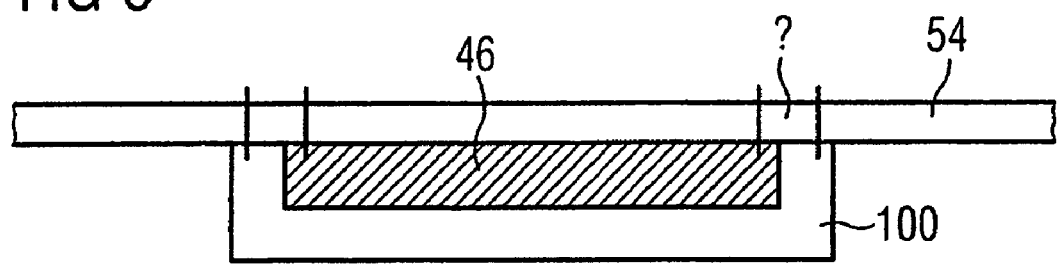
FIG. 6 shows a schematic illustration of the connection of the power semiconductor module from FIG. 5 to a printed circuit board.

By contrast, one development of the invention provides for the intermediate-circuit capacitor to be arranged on a printed circuit board and said printed circuit board is connected to the power semiconductor module by soldering and/or pressing the intermediate-circuit capacitor onto said power semiconductor module, the intermediate-circuit capacitor projecting into the power semiconductor module in this case. FIG. 6 shows such an arrangement in cross section. The intermediate-circuit capacitor 46 is arranged on the printed circuit board 44, said capacitor being connected to the power semiconductor module 100 by being soldered on or pressed on. Accordingly, it projects into said power semiconductor module 100. It goes without saying that alternatively or supplementarily to the intermediate-circuit capacitor 46, other components connected to the printed circuit board 54 may also project into the free space of the power semiconductor module 100, for example drivers.

In the exemplary embodiment illustrated in FIGS. 4 and 5, the positive terminal pins 35, 36, the negative terminal pins 40, 41, 42 and gate terminals g-hs-w, g-hs-v, g-hs-u are driven by means of connections 60, 61 realized by means of bonding wires or welded, in particular laser-welded, or soldered clips. With the use of clips, furthermore, the connection may be realized by means of low-temperature connection techniques (LTC).

If, as described above, a thick contiguous metallization is provided on the power semiconductor components, then the bonding land points may furthermore be arranged directly on the power semiconductor components without the bonding or welding operations associated with this being accompanied by destruction of the power semiconductor components. In the case of the power semiconductor modules known hitherto, by contrast, this is not practical on account of excessively high losses of yield.

The positive and negative leads 48 and 50, respectively, to the intermediate-circuit capacitor 46 that are shown in FIG. 5 are likewise embodied in the form of bonding wires or soldered clips in the manner described above.

As shown in FIGS. 4 and 5, a power semiconductor module 100 according to the invention comprises a large number of terminal pins 35, 36, 40, 41, 42, u, v, w, g-hs-u, g-hs-v, g-hs-w which are very wide and uniformly distributed. In conjunction with the printed circuit board 54 (cf. FIG. 6) arranged above the power semiconductor module 100, this effects a wide distribution of the load current and of the current in the intermediate circuit. Consequently, with the power semiconductor module 100 according to the inventions significantly higher current intensities can be carried via the power semiconductor module 100 and the associated printed circuit board (54). By way of example, in the case of converters that use printed circuit boards for the entire wiring, the current that can be fed is increased by more than a factor of 2.

In order to stabilize the connections to terminal pins, such as the connections 60 to the terminal pins 35, 36, 40, 41, 42, u, v, w, g-hs-u, g-hs-v, g-hs-w in the case of the power semiconductor module 100 in FIGS. 5 and 6, one development of the invention provides for at least one portion of the connections provided on the power semiconductor module to be integrally cast to form terminal pins.

Moreover, an advantageous configuration variant of the invention provides for at least one frame to be provided on the power semiconductor module, said frame being dimensioned and arranged such that it protects the connections at least in part against being touched and against mechanical damage. It goes without saying that not only continuous frames but also frames formed by frame sections adjoining interruptions of the frame are suitable for this. Such interruptions may be utilized for example for leading connections through the frame.

Such frames 64, 65, 66 are illustrated in the exemplary embodiment shown in FIG. 4. The frames 64, 65, 66 respectively surround a "basis" power semiconductor module 1 which is the subject matter of the illustrations in FIGS. 1 to 3 and the associated description.

LIST OF REFERENCE SYMBOLS

1 Power semiconductor module
2 IGBT
4 IGBT
6 IGBT
8 IGBT
10 Diode
12 Diode
14 Substrate
16 Substrate surface
20 First area section
22 Second area section
24 Metallization in second conduction plane 26 Metallization in second conduction plane
30 Supply/control line
32 Magnetic film
33 Magnetic film
35 Positive terminal pins
36 Positive terminal pins
40 Negative terminal pins
41 Negative terminal pins
42 Negative terminal pins
46 Intermediate-circuit capacitor
48 Positive leads
50 Negative leads
54 Printed circuit board
60 Connections to terminal pins
64 Frame
65 Frame
66 Frame
69 Power semiconductor module
70 IGBT 100 A
79 Power semiconductor module
80 IGBT 25 A
82 IGBT 25 A
84 IGBT 25 A
86 IGBT 25 A
100 Power semiconductor module
u Terminal pins for phase
v Terminal pins for phase
w Terminal pins for phase
g-hs-u Gate terminal
g-hs-v Gate terminal
g-hs-w Gate terminal

What is claimed is:

1. A power semiconductor module comprising power semiconductor components arranged on an electrically conductive surface of a substrate, at least one portion of the power semiconductor components being electrically connected in parallel and arranged symmetrically on the electrically conductive surface of the substrate,
wherein a second conduction plane is provided for making contact with the power semiconductor components, said second conduction plane being arranged in a manner electrically insulated from the electrically conductive surface of the substrate above the surfaces of the power semiconductor components that are remote from the electrically conductive surface of the substrate.

2. A power semiconductor module according to claim 1, wherein the power semiconductor components connected in parallel are identical.

3. A power semiconductor module according to claim 1, wherein the electrically conductive surface of the substrate is subdivided into two area sections embodied in electrically conductive fashion.

4. A power semiconductor module according to claim 3, wherein the area sections are electrically conductively connected to one another in a half-bridge circuit by means of connection in series.

5. A power semiconductor module according to claim 1, wherein contact areas for supply and control lines of the power semiconductor components are in each case provided on the surfaces of the power semiconductor components that are remote from the electrically conductive surface of the substrate.

6. A power semiconductor module according to claim 5, wherein mutually corresponding supply and control lines of power semiconductor components connected in parallel are in each case connected by a contiguous metallization, in particular by a metallization having a thickness in a range of 20 μm to 1 mm.

7. A power semiconductor module according to claim 6, wherein the geometrical structure of the contiguous metallizations is configured in such a way as to suppress the arising of parasitic oscillations, in particular of parasitic oscillations having frequencies of above 100 MHz.

8. A power semiconductor module according to claim 1, wherein, for the purpose of insulating the second conduction plane from the electrically conductive surface of the substrate, at least one insulating film comprising magnetic constituents is arranged between the second conduction plane and the electrically conductive surface of the substrate.

9. A power semiconductor module according to claim 1, wherein at least one magnetic film that at least partly covers the second conduction plane is arranged on that side of the second conduction plane which is remote from the electrically conductive surface of the substrate.

10. A power semiconductor module according to claim 1, wherein at least one portion of the power semiconductor components are transistors, in particular insulated gate bipolar transistors.

11. A power semiconductor module according to claim 10, wherein at least one portion of the gate contacts is connected to one another by means of narrow, thin interconnects, the length, width and thickness of said interconnects being dimensioned such that a distributed resistance having a resistance value>0.1 ohm is provided upstream of each of the transistors contact-connected to said interconnects.

12. A power semiconductor module according to claim 10, wherein, in the case of at least one transistor, the contact connection of the emitter in the case of the control circuit formed from gate and emitter and in the case of the load circuit formed from emitter and collector is realized via the same contact.

13. A power semiconductor module according to claim 1, wherein terminal pins for a +/− intermediate circuit are arranged along the longitudinal sides of the power semiconductor module.

14. A power semiconductor module according to claim 13, wherein the remaining terminal pins are arranged on the sides of the power semiconductor module.

15. A power semiconductor module according to claim 14, wherein at least one portion of an intermediate-circuit capacitor is arranged in the power semiconductor module above the power semiconductor components, this portion of the intermediate-circuit capacitor being configured in parallelepidal fashion, in particular.

16. A power semiconductor module according to claim 15, wherein the intermediate-circuit capacitor is arranged on a printed circuit board and said printed circuit board is connected to the power semiconductor module by soldering and/or pressing the intermediate-circuit capacitor onto said power semiconductor module.

17. A power semiconductor module according to claim 1, wherein at least one portion of the connections provided on the power semiconductor module is integrally cast to form terminal pins.

18. A power semiconductor module according to claim 1, wherein at least one frame is provided on the power semiconductor module, said frame being dimensioned and arranged such that it protects the connections at least in part against being touched and against mechanical damage.

19. A power semiconductor module comprising power semiconductor components arranged on an electrically conductive surface of a substrate, at least one portion of the power semiconductor components being electrically connected in parallel and arranged symmetrically on the electrically conductive surface of the substrate, wherein a second conduction plane is provided for making contact with the power semiconductor components, said second conduction plane being arranged in a manner electrically insulated from the electrically conductive surface of the substrate above the surfaces of the power semiconductor components that are remote from the electrically conductive surface of the substrate, wherein the electrically conductive surface of the substrate is subdivided into two area sections embodied in electrically conductive fashion, and wherein the area sections are electrically conductively connected to one another in a half-bridge circuit by means of connection in series.

20. A power semiconductor module comprising power semiconductor components arranged on an electrically conductive surface of a substrate, at least one portion of the power semiconductor components being electrically connected in parallel and arranged symmetrically on the electrically conductive surface of the substrate, wherein a second conduction plane is provided for making contact with the power semiconductor components, said second conduction plane being arranged in a manner electrically insulated from the electrically conductive surface of the substrate above the surfaces of the power semiconductor components that are remote from the electrically conductive surface of the substrate, wherein contact areas for supply and control lines of the power semiconductor components are in each case provided on the surfaces of the power semiconductor components that are remote from the electrically conductive surface of the substrate, and wherein mutually corresponding supply and control lines of power semiconductor components connected in parallel are in each case connected by a contiguous metallization, in particular by a metallization having a thickness in a range of 20 µm to 1 mm.

\* \* \* \* \*